US011843359B2

(12) United States Patent
Hahn

(10) Patent No.: US 11,843,359 B2
(45) Date of Patent: Dec. 12, 2023

(54) AMPLIFICATION SYSTEM AND METHOD

(71) Applicant: Kurt P Hahn, Calgary (CA)

(72) Inventor: Kurt P Hahn, Calgary (CA)

( * ) Notice: Subject to any disclaimer, the term of this patent is extended or adjusted under 35 U.S.C. 154(b) by 0 days.

(21) Appl. No.: 16/022,257

(22) Filed: Jun. 28, 2018

(65) Prior Publication Data

US 2023/0291374 A1    Sep. 14, 2023

(51) Int. Cl.
| | | |
|---|---|---|
| *H03G 3/30* | (2006.01) |
| *H03F 1/02* | (2006.01) |
| *H03F 3/181* | (2006.01) |
| *H03F 3/20* | (2006.01) |
| *H04R 1/40* | (2006.01) |
| *H04R 3/12* | (2006.01) |
| *H04R 7/12* | (2006.01) |
| *H04R 9/06* | (2006.01) |
| *H04N 5/60* | (2006.01) |
| *H04N 7/015* | (2006.01) |
| *H04N 7/10* | (2006.01) |
| *H03F 3/183* | (2006.01) |
| *H03F 3/68* | (2006.01) |
| *H04R 3/14* | (2006.01) |
| *H04R 5/04* | (2006.01) |
| *H04R 27/00* | (2006.01) |

(52) U.S. Cl.
CPC ............. *H03G 3/3005* (2013.01); *H03F 1/02* (2013.01); *H03F 3/181* (2013.01); *H03F 3/20* (2013.01); *H04R 1/403* (2013.01); *H04R 3/12* (2013.01); *H04R 7/127* (2013.01); *H04R 9/06* (2013.01); *H03F 2200/03* (2013.01); *H03F 2200/63* (2013.01); *H04N 5/602* (2013.01); *H04N 7/015* (2013.01); *H04N 7/10* (2013.01)

(58) Field of Classification Search
None
See application file for complete search history.

(56) References Cited

U.S. PATENT DOCUMENTS

| | | | |
|---|---|---|---|
| 5,349,301 A | 9/1994 | Kaiwa | |
| 6,792,120 B1 * | 9/2004 | Szenics | G10H 3/146 181/141 |

(Continued)

FOREIGN PATENT DOCUMENTS

JP        H04313996 A        11/1992

OTHER PUBLICATIONS

What Hi-Fi? "Yamaha A-S501 stereo amplifier—unboxing video." Aug. 22, 2014. (Year: 2014) https://www.youtube.com/watch?v=FLIEH5F46k4.*

*Primary Examiner* — Qin Zhu

(74) *Attorney, Agent, or Firm* — Argus Intellectual Enterprise; Jordan Sworen; Daniel Enea

(57) ABSTRACT

An amplification system which includes a source of electrical audio signals, a first amplifier, a second amplifier, a plurality of loudspeakers, and a first phase of the first amplifier and a second phase of the second amplifier reproduced in parallel having a time delay between first and second phase amplification for out of phase correction. The time delay is configured to correct poor sound signals while amplifying weaker harmonics and sound signals of different frequencies, thereby adjusting sound output of the amplification system and acoustical characteristics of a room. The amplification system is useful for providing improved sound quality and increased audio efficiencies.

20 Claims, 5 Drawing Sheets

(56) References Cited

U.S. PATENT DOCUMENTS

| | | | |
|---|---|---|---|
| 7,834,702 B2 | 11/2010 | Jones et al. | |
| 8,443,217 B2 * | 5/2013 | Higuchi | H04N 5/77 381/120 |
| 2002/0018576 A1 * | 2/2002 | Shima | H04R 1/025 381/396 |
| 2005/0084117 A1 * | 4/2005 | Miyashita | H03G 5/10 381/97 |
| 2007/0019816 A1 * | 1/2007 | Konagai | H04R 3/12 381/59 |
| 2007/0229717 A1 * | 10/2007 | Tseng | G11B 20/10527 348/738 |
| 2009/0081948 A1 * | 3/2009 | Banks | H04R 5/02 455/3.05 |
| 2009/0281643 A1 * | 11/2009 | Higuchi | H04N 5/44 700/94 |
| 2010/0014702 A1 * | 1/2010 | Silver | H04R 9/06 381/398 |
| 2010/0053471 A1 * | 3/2010 | Shikata | H04N 5/60 348/738 |
| 2010/0128176 A1 * | 5/2010 | Nakajima | G09G 5/006 348/512 |
| 2010/0296657 A1 * | 11/2010 | Sup | H04R 1/26 381/28 |
| 2013/0039451 A1 * | 2/2013 | Perthold | G01R 23/16 375/344 |

* cited by examiner

AMPLIFICATION SYSTEM AND METHOD

BACKGROUND OF THE INVENTION

The following includes information that may be useful in understanding the present disclosure. It is not an admission that any of the information provided herein is prior art nor material to the presently described or claimed inventions, nor that any publication or document that is specifically or implicitly referenced is prior art.

TECHNICAL FIELD

The present invention relates generally to the field of amplifiers of existing art and more specifically relates to devices for amplifying electronic audio signals.

RELATED ART

With a conventional power amplifier, the maximum available output power is generally limited by at least two factors: the voltage swing available at the amplifier's output, and the load impedance. The voltage swing is itself typically limited by the amplifier rail voltage. In the case of a car audio amplifier for instance, the rail voltage is the nominal 14.4 Volts of the car battery; thus, if the amplifier were able to swing all the way up to the power rails, it could deliver 7 Volts peak output. This peak voltage is only sufficient to deliver about 3 Watts of power to an 8Ω load. To obtain greater output power, the load impedance can be reduced (for example, a 1Ω load would allow 25 Watts of output power), but in order not to encounter significant losses in the wiring, the cables need to be thicker and heavier.

One technique for increasing output voltage is known as bridging, whereby two anti-phase amplifiers are used with the load tied between their outputs. This approach can double the available output swing and for a given load impedance, which would quadruple the output power. Even so, the maximum available power to a 1Ω load, using the typical power supply conditions described above, would be limited to approximately 100 Watts, and would still have the complication of a low impedance load. However, this simplified analysis hides the fact that under these conditions, each amplifier is not only having to supply twice the output current as compared to the non-bridged condition, but also sees half the effective load impedance. In practical applications, the amplifiers may not be able to supply the required current. A suitable solution is desired.

U.S. Pat. No. 7,834,702 to Owen Jones, et al. relates to an efficient power amplifier. The described efficient power amplifier includes a dynamic power supply for N amplifiers that includes first and second power boost circuits which temporarily boost the positive or negative power supply rail, respectively. A control circuit monitors amplifier output signal levels and provides power boost control signals to the power boost circuits, which temporarily raise the positive supply voltage above the nominal voltage level in tandem with the highest output signal from the N amplifiers and lower the negative supply voltage below the nominal voltage level in tandem with the lowest output signal level from the N amplifiers. The power boost circuits each may be coupled to a reservoir capacitor from which current is drawn to provide the power boost. When inactive, the reservoir capacitors charge up from the respective power supply rails. The dynamic power supply is well suited for audio amplification systems.

SUMMARY OF THE INVENTION

In view of the foregoing disadvantages inherent in the known amplifier art, the present disclosure provides a novel amplification system and method. The general purpose of the present disclosure, which will be described subsequently in greater detail, is to provide a multiple amplifier sound system for improved sound quality and more efficient operation.

An amplification system is disclosed herein. The amplification system may include a source of electrical audio signals, a first amplifier, a second amplifier, a plurality of loudspeakers, and a first phase of the first amplifier and a second phase of the second amplifier reproduced in parallel having a time delay between first and second phase amplification for out of phase correction. The time delay may be configured to correct poor sound signals while amplifying weaker harmonics and sound signals of different frequencies, thereby adjusting sound output of the amplification system and acoustical characteristics of a room. The amplification system may be useful for providing improved sound quality and increased audio efficiencies.

According to another embodiment, a method of using an amplification system is also disclosed herein. The method of using an amplification system may include providing an amplification system including a source of electrical signals, a first amplifier, a second amplifier, and a plurality of loudspeakers, and producing a time delay between a first phase amplification of the first amplifier and a second phase amplification of the second amplifier for out of phase correction.

For purposes of summarizing the invention, certain aspects, advantages, and novel features of the invention have been described herein. It is to be understood that not necessarily all such advantages may be achieved in accordance with any one particular embodiment of the invention. Thus, the invention may be embodied or carried out in a manner that achieves or optimizes one advantage or group of advantages as taught herein without necessarily achieving other advantages as may be taught or suggested herein. The features of the invention which are believed to be novel are particularly pointed out and distinctly claimed in the concluding portion of the specification. These and other features, aspects, and advantages of the present invention will become better understood with reference to the following drawings and detailed description.

BRIEF DESCRIPTION OF THE DRAWINGS

The figures which accompany the written portion of this specification illustrate embodiments and methods of use for the present disclosure, an amplification system and method, constructed and operative according to the teachings of the present disclosure.

The various embodiments of the present invention will hereinafter be described in conjunction with the appended drawings, wherein like designations denote like elements.

DETAILED DESCRIPTION

As discussed above, embodiments of the present disclosure relate to an amplifier and more particularly to an amplification system and method as used to provide a multiple amplifier sound system for improved sound quality and more efficient operation.

Generally, the amplification system of this disclosure relates to a dual/multiple amplifier sound system for better sound and more efficient operation. The system may allow for an HDMI cable to be hooked up with lower end speakers, while reducing or eliminating any distortion that is generated by a slightly delayed second signal. In the end the stereo may operate more efficiently, cooler, and clearer. The resulting sound may be audibly improved.

In this system, one amplifier may run the higher frequencies, while the other runs the lower ones. One output with an amplifier may be hooked up through a DVD player using an HDMI cable. In a preferred embodiment, that one output may be connected to a set of 2 (preferably) walnut tower speakers with each tower having a tweeter (upper), midrange (middle), and woofer (lower). The other output may be a speaker system with two smaller speakers and a subwoofer that doubles as another amplifier. Each of these channels may have two speakers. A user can generally use any brand or manufacturer of speakers. There may be one volume control for each stereo. By adjusting each volume control, one can eliminate wow, flutter, rumble, feedback, and virtually all distortion. Also, by adding amplifiers each unit works cooler and more efficiently. The smaller system is in the center and the towers are on the ends. The secondary amplifier/subwoofer can be put anywhere desired. The result is crystal clear sound that lets the stereo work less. The components associated with this system may be configured for compatibility with 4K, surround sound, and/or reflective sound standards.

Referring now more specifically to the drawings by numerals of reference, there is shown in FIGS. 1-4, various views of an amplification system 100.

Figure 1:
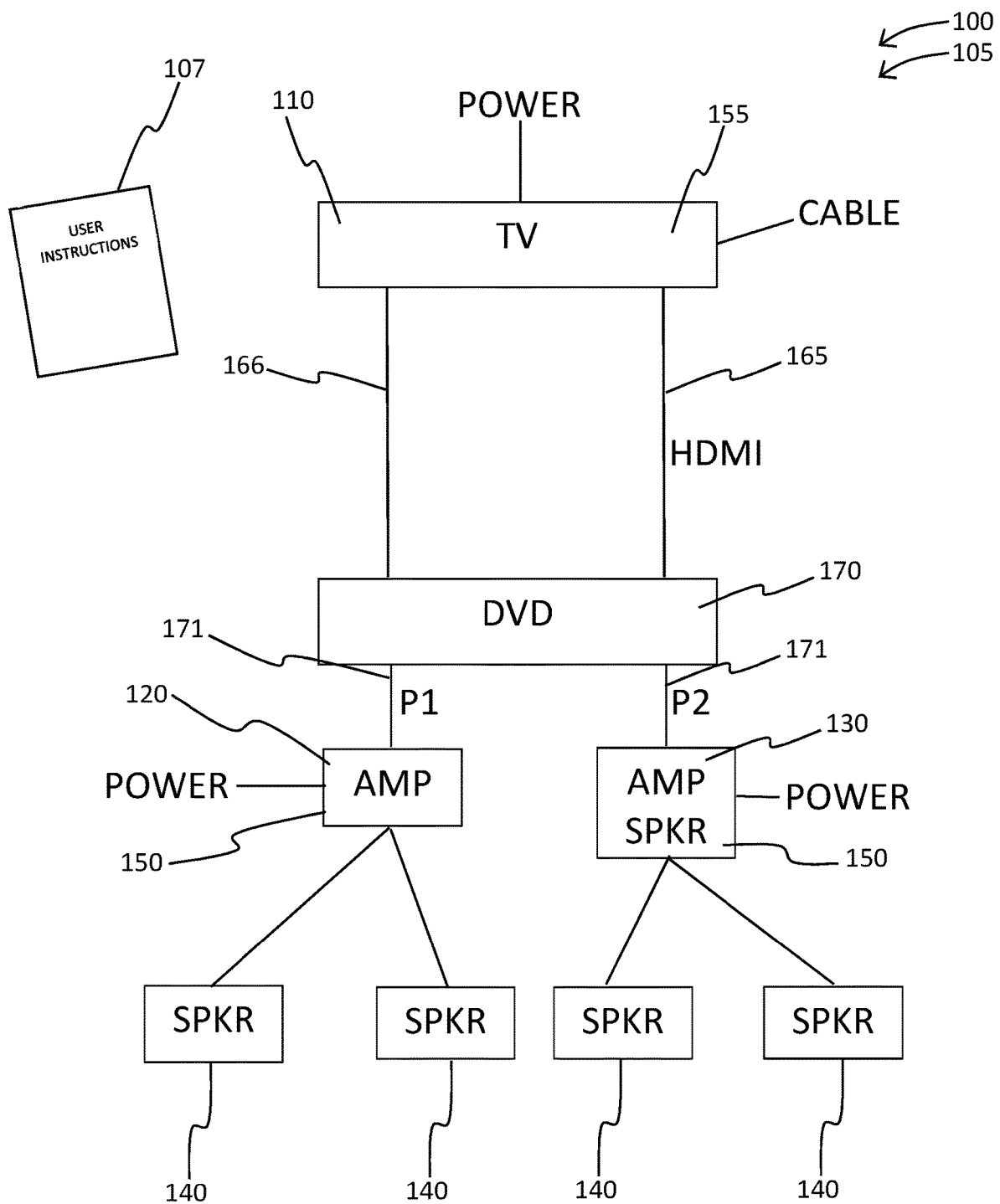
FIG. 1 is a schematic view of the amplification system during an 'in-use' condition, according to an embodiment of the disclosure.

FIG. 1 shows an amplification system 100, according to an embodiment of the present disclosure. Here, the amplification system 100 may be beneficial for use by a user to provide a multiple amplifier sound system for improved sound quality and more efficient operation. As illustrated, the amplification system 100 may include a source of electrical audio signals 110 comprising a television 155, a first amplifier 120 removably couplable to the source of electrical audio signals 110, a second amplifier 130 removably couplable to the source of electrical audio signals 110, and plurality of loudspeakers 140. The plurality of loudspeakers 140 may be removably coupled to a plurality of amplifiers 150 comprising at least the first amplifier 120 and the second amplifier 130. The amplification system 100 may further include an HDMI cable 165 and a high-definition-format cable 166 removably coupled to the television 155. Finally, the system 100 may also include a high-definition-format DVD player 170 having a plurality of outputs 171, wherein the high-definition-format DVD player 170 may be removably coupled to the high-definition-format cable 166 and the HDMI cable 165 for distributing signals to the plurality of amplifiers 150.

According to one embodiment, the amplification system 100 may be arranged as a kit 105. In particular, the amplification system 100 may further include a set of instructions 107. The instructions 107 may detail functional relationships in relation to the structure of the amplification system 100 such that the amplification system 100 can be used, maintained, or the like, in a preferred manner.

Figure 2:
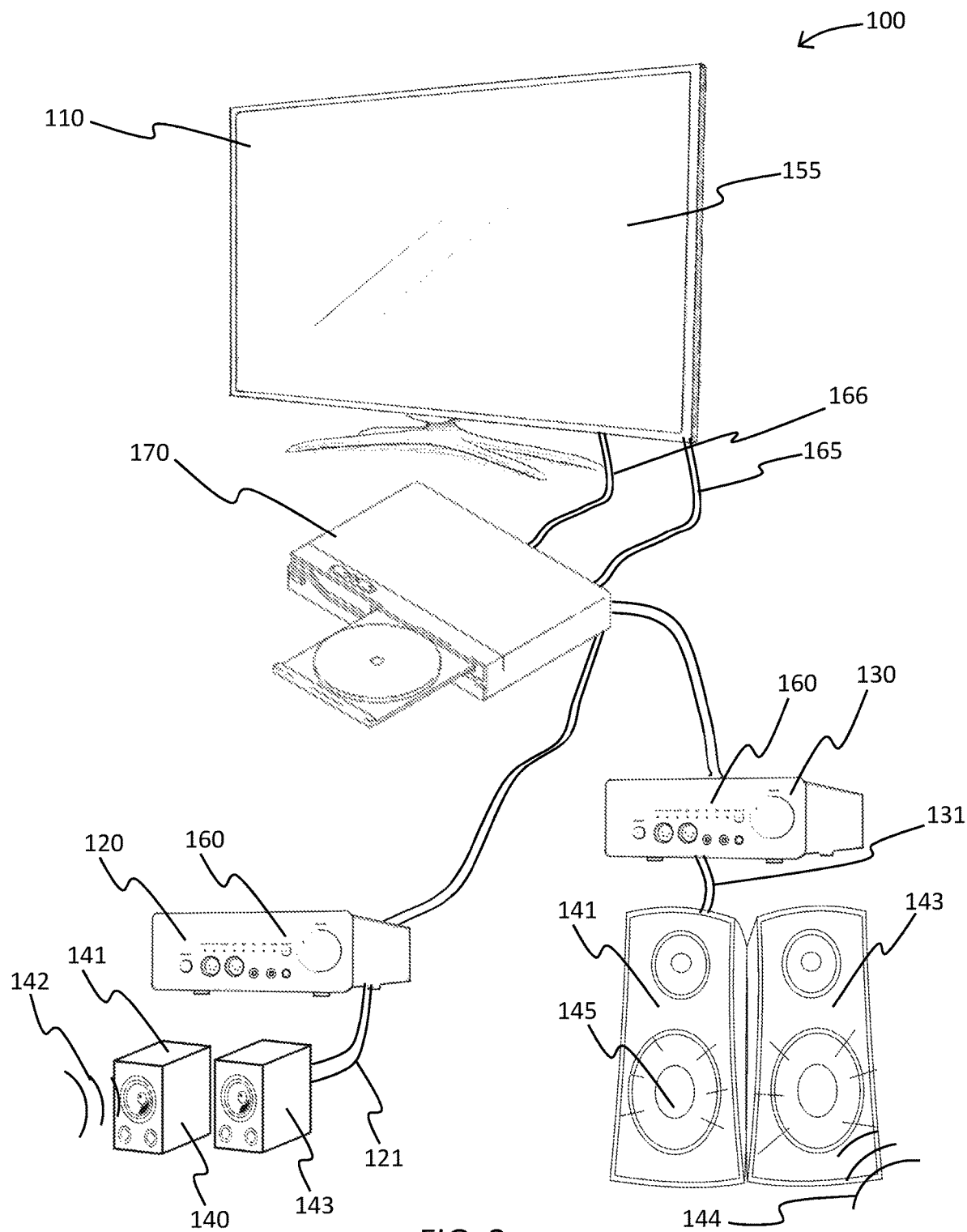
FIG. 2 is a component view of the amplification system of FIG. 1, according to an embodiment of the present disclosure.

Referring now to FIG. 2 showing the amplification system 100 of FIG. 1, according to an embodiment of the present disclosure. As above, the amplification system 100 may include a source of electrical audio signals 110 comprising a television 155, a first amplifier 120, a second amplifier 130, and a plurality of loudspeakers 140. The plurality of loudspeakers 140 may be removably coupled to the first amplifier 120 and the second amplifier 130. The amplification system 100 may further include an HDMI cable 165 and a high-definition-format cable 166 removably coupled to the television 155. The system 100 may also include a high-definition-format DVD player 170 removably coupled to the high-definition-format cable 166 and the HDMI cable 165. Further still, the system 100 may include a first phase 121 of the first amplifier 120 and a second phase 131 of the second amplifier 130 reproduced in parallel having a time delay 160 between first phase 121 and second phase 131 amplification for out of phase correction. One of the plurality of loudspeakers 140 may be a first loudspeaker 141 having a cone 145 for receiving the amplified electrical audio signals and converting the amplified electrical audio signals into first sound signals 142. Similarly, a second of the plurality of loudspeakers 140 may be a second loudspeaker 143 for receiving and converting the cone vibration electrical signals into second sound signals 144.

Figure 3:
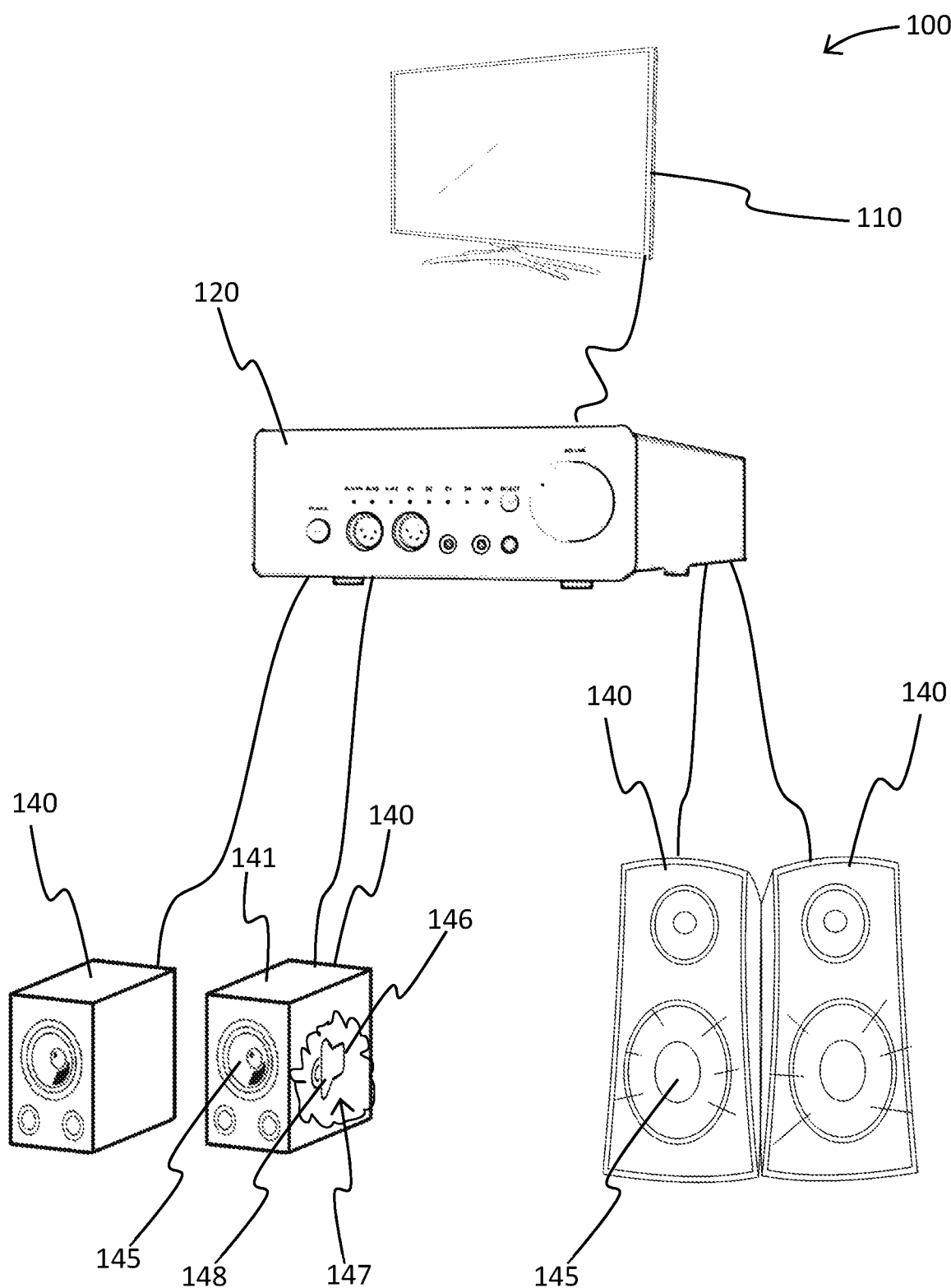
FIG. 3 is a schematic view of the amplification system of FIG. 1, according to an embodiment of the present disclosure.

FIG. 3 is a schematic view of the amplification system 100 of FIG. 1, according to an embodiment of the present disclosure. Here again, the amplification system 100 may include the source of electrical audio signals 110 removably coupled to the first amplifier 120. The first amplifier 120 may be removably coupled to the plurality of loudspeakers 140 and configured to supply amplified audio signals to each of the plurality of loudspeakers 140. The first loudspeaker 141 may include a cone 145. The first loudspeaker may further include a rear cone driving portion 146 having a stationary magnet 147 and a voice coil 148 connected to the cone 145.

Figure 4:
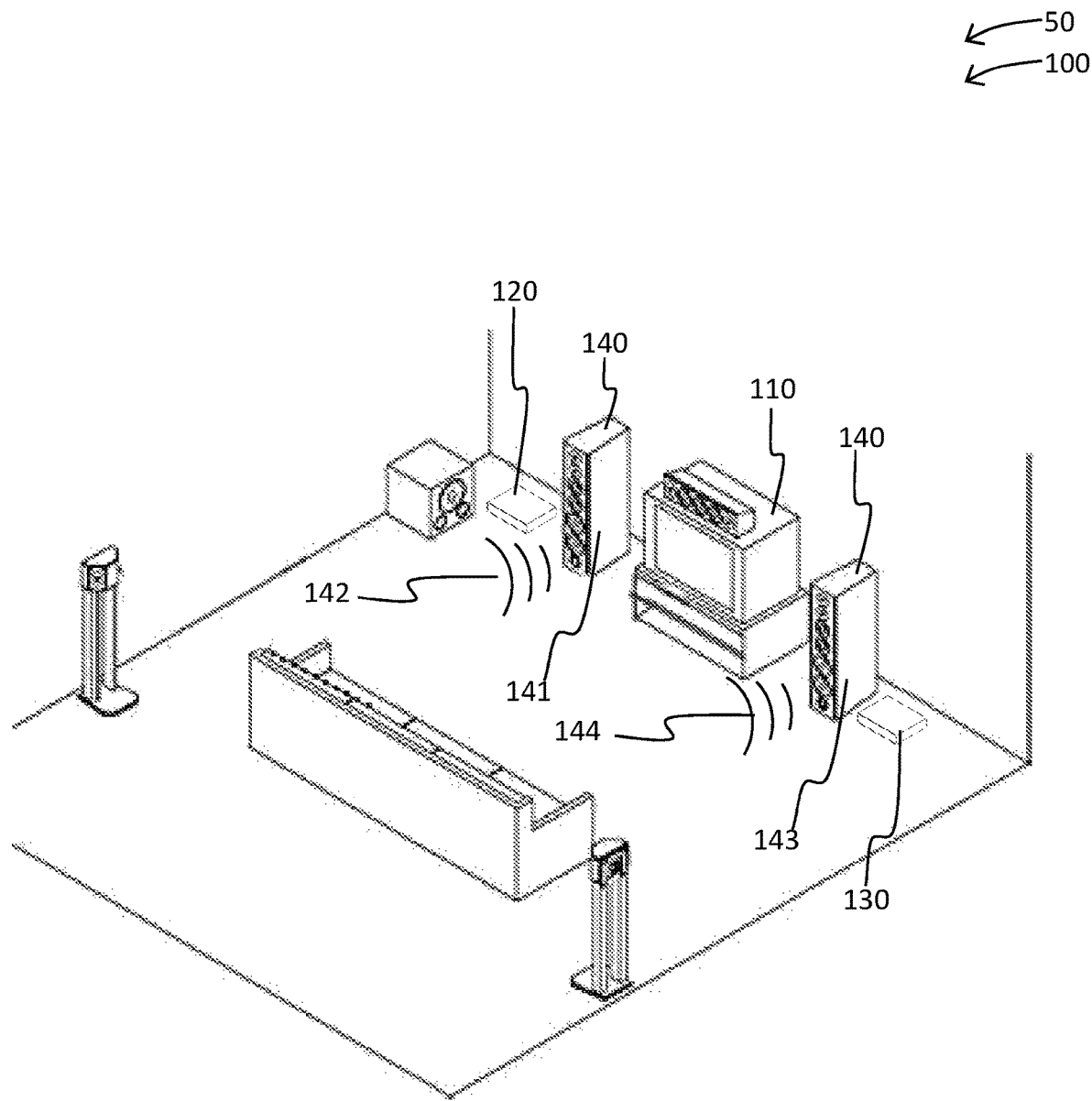
FIG. 4 is a perspective view of the amplification system of FIG. 1, according to an embodiment of the present disclosure.

FIG. 4 is a perspective view of the amplification system 100 of FIG. 1 during an 'in-use' condition 50, according to an embodiment of the present disclosure. As above, the amplification system 100 may include a source of electrical audio signals 110, a first amplifier 120 removably couplable to the source of electrical audio signals 110, a second amplifier 130 removably couplable to the source of electrical audio signals 110, and a plurality of loudspeakers 140. One of the plurality of loudspeakers 140 may be a first loudspeaker 141 for receiving the amplified electrical audio signals and converting the amplified electrical audio signals into first sound signals 142. Similarly, a second of the plurality of loudspeakers 140 may be a second loudspeaker 143 for receiving and converting the cone vibration electrical signals into second sound signals 144.

Figure 5:
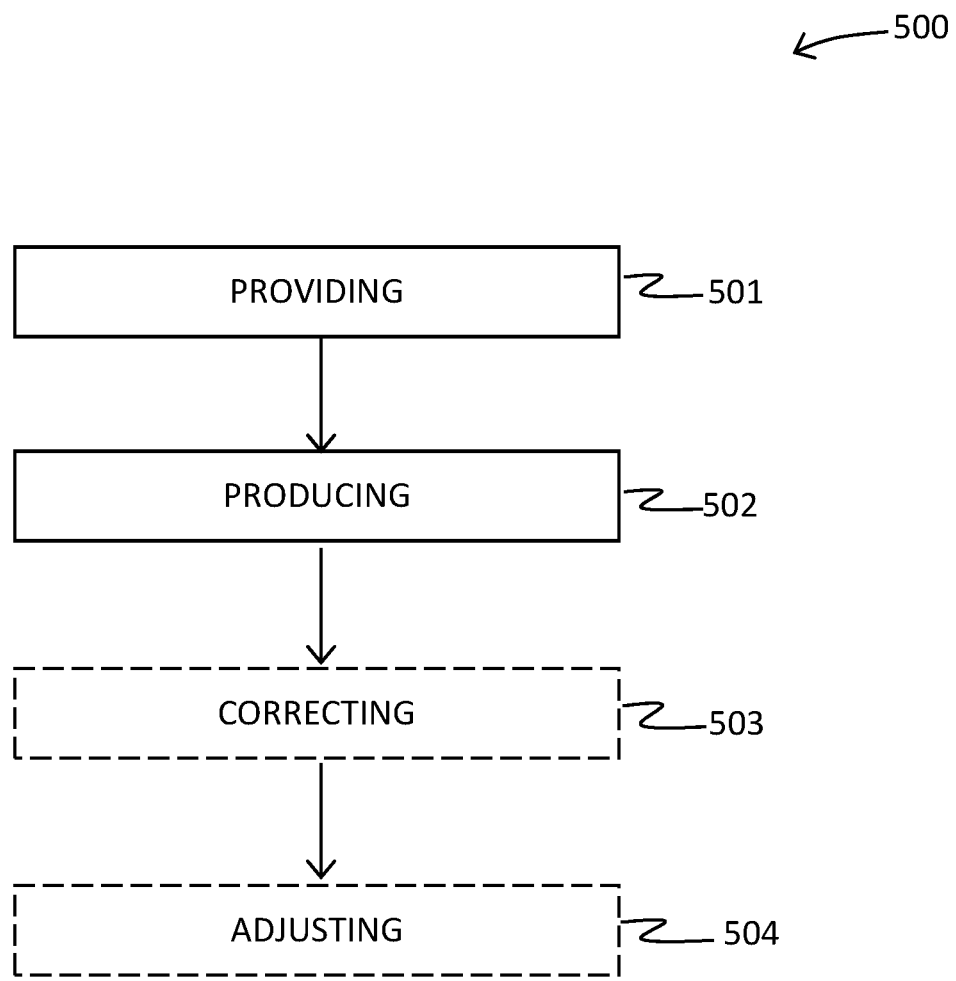
FIG. 5 is a flow diagram illustrating a method of using the disclosed amplification system, according to an embodiment of the present disclosure.

Referring now to FIG. 5, a flow diagram illustrating a method of using 500 an amplification system 100, according to an embodiment of the present disclosure. In particular, the method of using 500 an amplification system 100 may include one or more components or features of the amplification system 100 as described above. As illustrated, the method of using 500 an amplification system 100 may include the steps of: step one 501, providing an amplification system for providing high-end audio output comprising a source of electrical audio signals, a first amplifier, the first amplifier removably coupled to the source of electrical audio signals, a second amplifier, the second amplifier removably coupled to the source of electrical audio signals, and a plurality of loudspeakers, the plurality of loudspeakers removably coupled to at least the first amplifier and the second amplifier; and, step two 502, producing a time delay between a first phase amplification of the first amplifier and a second phase amplification of the second amplifier for out of phase correction. The time delay is configured to correct poor sound signals while amplifying weaker harmonics and sound signals of different frequencies, thereby adjusting sound output of the amplification system and acoustical characteristics of a room, the amplification system operating to permit sound generation to be independent of volume levels.

It should be noted that step three 503, correcting poor sound signals while amplifying weaker harmonics and sound signals of different frequencies, and step four 504, adjusting sound output of the amplification system and the acoustical characteristics of a room, are optional steps and may not be implemented in all cases. Optional steps of method of use 500 are illustrated using dotted lines in FIG. 5 so as to distinguish them from the other steps of method of use 500. It should also be noted that the steps described in the method of use can be carried out in many different orders according to user preference. The use of "step of" should not be interpreted as "step for", in the claims herein and is not intended to invoke the provisions of 35 U.S.C. § 112(f). It should also be noted that, under appropriate circumstances, considering such issues as design preference, user preferences, marketing preferences, cost, structural requirements, available materials, technological advances, etc., other methods for the amplification system, are taught herein.

The embodiments of the invention described herein are exemplary and numerous modifications, variations and rearrangements can be readily envisioned to achieve substantially equivalent results, all of which are intended to be embraced within the spirit and scope of the invention. Further, the purpose of the foregoing abstract is to enable the U.S. Patent and Trademark Office and the public generally, and especially the scientist, engineers and practitioners in the art who are not familiar with patent or legal terms or phraseology, to determine quickly from a cursory inspection the nature and essence of the technical disclosure of the application.

What is claimed is new and desired to be protected by Letters Patent is set forth in the appended claims:

1. An amplification system for providing high-end audio output comprising:
    a source of electrical audio signals;
    a plurality of amplifiers comprising;
        a first amplifier, the first amplifier removably couplable to the source of electrical audio signals;
        a second amplifier, the second amplifier removably couplable to the source of electrical audio signals;
        wherein the electrical audio signal received by the second amplifier is delayed by a signal delay time;
    a plurality of loudspeakers, the plurality of loudspeakers removably couplable to the plurality of amplifiers;
    a first phase produced by the first amplifier and a second phase produced by the second amplifier, wherein the first and second phases are reproduced in parallel;
    wherein the amplification system produces a time delay between said first and second phase amplification for out of phase correction; and
    wherein the time delay between the first phase and the second phase is equal to the signal delay time for out of phase correction;
    wherein the time delay is configured to correct poor sound signals while amplifying weaker harmonics and sound signals of different frequencies, thereby adjusting the sound output of the amplification system.

2. The amplification system of claim 1, wherein the first amplifier is configured to receive and amplify the electrical audio signals.

3. The amplification system of claim 1, wherein the second amplifier is configured to receive and amplify cone vibration electrical signals.

4. The amplification system of claim 1, wherein one of the plurality of loudspeakers is a first loudspeaker for receiving the amplified electrical audio signals and converting the amplified electrical audio signals into first sound signals.

5. The amplification system of claim 3, wherein a second of the plurality of loudspeakers is a second loudspeaker for receiving and converting the cone vibration electrical signals into second sound signals.

6. The amplification system of claim 4, wherein the first loudspeaker includes a cone.

7. The amplification system of claim 6, wherein the first loudspeaker further includes a rear-cone driving portion.

8. The amplification system of claim 7, wherein the rear-cone driving portion includes a stationary magnet, and a voice coil connected to the cone.

9. The amplification system of claim 7, wherein the first amplifier amplifies sounds at higher range frequencies in a first phase and transmits to the first loudspeaker for the production of higher frequency sound.

10. The amplification system of claim 9, wherein the second amplifier amplifies sounds at lower range frequencies in a second phase and transmits to the second loudspeaker for the production of lower frequency sounds.

11. The amplification system of claim 1, wherein the source of electrical audio signals comprises a television.

12. The amplification system of claim 11, wherein the amplification system further includes an HDMI cable removably coupled to the television.

13. The amplification system of claim 12, wherein the amplification system further includes a high-definition-format cable removably coupled to the television.

14. The amplification system of claim 13, wherein the amplification system further includes a high-definition-format DVD player removably coupled to the high-definition-format cable and the HDMI cable.

15. The amplification system of claim 14, wherein the high-definition-format DVD player includes a plurality of outputs.

16. The amplification system of claim 15, wherein the plurality of outputs are in fluid communication with the first amplifier and the second amplifier.

17. An amplification system for providing high-end audio output comprising:
    a source of electrical audio signals;
    a plurality of amplifiers comprising;
        a first amplifier, the first amplifier removably couplable to the source of electrical audio signals;
        a second amplifier, the second amplifier removably couplable to the source of electrical audio signals;
        wherein the electrical audio signal received by the second amplifier is delayed by a signal delay time;

a plurality of loudspeakers, the plurality of loudspeakers removably couplable to the plurality of amplifiers;

a first phase produced by the first amplifier and a second phase produced by the second amplifier, wherein the first and second phases are reproduced in parallel;

wherein the amplification system produces a time delay between said first and second phase amplification for out of phase correction; and wherein the time delay between the first phase and the second phase is equal to the signal delay time for out of phase correction;

wherein the time delay is configured to correct poor sound signals while amplifying weaker harmonics and sound signals of different frequencies, thereby adjusting the sound output of the amplification system;

wherein the first amplifier is configured to receive and amplify the electrical audio signals;

wherein the second amplifier is configured to receive and amplify cone vibration electrical signals;

wherein one of the plurality of loudspeakers is a first loudspeaker for receiving the amplified electrical audio signals and converting the amplified electrical audio signals into first sound signals;

wherein a second of the plurality of loudspeakers is a second loudspeaker for receiving and converting the cone vibration electrical signals into second sound signals;

wherein the first loudspeaker includes a cone;

wherein the first loudspeaker further includes a rear cone driving portion;

wherein the rear cone driving portion includes a stationary magnet, and a voice coil connected to the cone;

wherein the first amplifier amplifies sounds at higher range frequencies in a first phase and transmits to the first loudspeaker for production of higher frequency sound;

wherein the second amplifier amplifies sounds at lower range frequencies in a second phase and transmits to the second loudspeaker for production of lower frequency sounds;

wherein the source of electrical audio signals comprises a television;

wherein the amplification system further includes an HDMI cable removably coupled to the television;

wherein the amplification system further includes a high-definition-format cable removably coupled to the television;

wherein the amplification system further includes a high-definition-format DVD player removably coupled to the high-definition-format cable and the HDMI cable;

wherein the high-definition-format DVD player includes a plurality of outputs; and wherein the plurality of outputs are in fluid communication with the first amplifier and the second amplifier.

18. The amplification system of claim 17, further comprising a set of instructions:

and wherein the amplification system is arranged as a kit.

19. A method of using an amplification system, the method comprising the steps of:

providing an amplification system for providing high-end audio output comprising:

a source of electrical audio signals; a first amplifier, the first amplifier removably coupled to the source of electrical audio signals, a second amplifier, the second amplifier removably coupled to the source of electrical audio signals, and a plurality of loudspeakers, the plurality of loudspeakers removably coupled to at least the first amplifier and the second amplifier;

wherein the electrical audio signal received by the second amplifier is delayed by a signal delay time;

producing a time delay between a first phase amplification of the first amplifier and a second phase amplification of the second amplifier for out of phase correction;

wherein the time delay between the first phase and the second phase is equal to the signal delay time for out of phase correction.

20. The method of claim 19, further comprising the steps of:

correcting poor sound signals while amplifying weaker harmonics and sound signals of different frequencies; and adjusting sound output of the amplification system.

* * * * *